United States Patent
Kim et al.

(10) Patent No.: US 9,543,513 B2
(45) Date of Patent: Jan. 10, 2017

(54) VARIABLE RESISTANCE MATERIAL LAYERS AND VARIABLE RESISTANCE MEMORY DEVICES INCLUDING THE SAME

(71) Applicants: Do-Hyung Kim, Seongnam-si (KR); Jong-Uk Kim, Yongin-si (KR); Dong-Ho Ahn, Hwaseong-si (KR); Sung-Lae Cho, Gwacheon-si (KR)

(72) Inventors: Do-Hyung Kim, Seongnam-si (KR); Jong-Uk Kim, Yongin-si (KR); Dong-Ho Ahn, Hwaseong-si (KR); Sung-Lae Cho, Gwacheon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/965,616

(22) Filed: Dec. 10, 2015

(65) Prior Publication Data

US 2016/0181521 A1    Jun. 23, 2016

(30) Foreign Application Priority Data

Dec. 23, 2014    (KR) .................. 10-2014-0186754

(51) Int. Cl.
  *H01L 45/00*    (2006.01)
  *H01L 27/24*    (2006.01)

(52) U.S. Cl.
  CPC ......... *H01L 45/144* (2013.01); *H01L 27/2418* (2013.01)

(58) Field of Classification Search
  None
  See application file for complete search history.

(56) References Cited

U.S. PATENT DOCUMENTS

| | | | |
|---|---|---|---|
| 6,143,468 A | 11/2000 | Ohno et al. | |
| 7,525,117 B2 | 4/2009 | Kostylev et al. | |
| 7,777,213 B2 * | 8/2010 | Kang ................. | C23C 14/0623 257/2 |
| 7,791,932 B2 | 9/2010 | Kuh et al. | |
| 2008/0105878 A1 * | 5/2008 | Ohara ................. | H01L 29/8613 257/74 |
| 2008/0175042 A1 * | 7/2008 | Kang ................. | C23C 14/0623 365/163 |
| 2009/0050869 A1 * | 2/2009 | Kim .................... | H01L 27/2436 257/2 |
| 2011/0204309 A1 * | 8/2011 | Nitta ................... | H01L 27/24 257/2 |
| 2013/0051123 A1 * | 2/2013 | Lee .................... | G11C 8/00 365/148 |

(Continued)

FOREIGN PATENT DOCUMENTS

| | | |
|---|---|---|
| JP | 1998-329422 | 12/1998 |
| JP | 2000-043414 | 2/2000 |

(Continued)

*Primary Examiner* — Hoang-Quan Ho
(74) *Attorney, Agent, or Firm* — Myers Bigel, P.A.

(57) ABSTRACT

A variable resistance material layer including germanium (Ge), antimony (Sb), tellurium (Te), and at least one type of impurities X. The variable resistance material layer having a composition represented by a chemical formula of $X_p(Ge_aSb_{(1-a-b)}Te_b)_{(1-p)}$, wherein an atomic concentration of the impurities X is in a range of $0<p\leq0.2$, an atomic concentration of Ge is in a range of $0.05\leq a<0.19$, and an atomic concentration of Te is in a range of $0.42\leq b\leq 0.56$.

19 Claims, 16 Drawing Sheets

(56) References Cited

U.S. PATENT DOCUMENTS

| | | | | |
|---|---|---|---|---|
| 2013/0078475 A1* | 3/2013 | Zheng | ............. | C01B 19/002 |
| | | | | 428/457 |
| 2013/0320290 A1* | 12/2013 | Park | ............. | H01L 45/1286 |
| | | | | 257/4 |
| 2015/0041747 A1* | 2/2015 | Kim | ............. | H01L 45/144 |
| | | | | 257/2 |

FOREIGN PATENT DOCUMENTS

| KR | 10-2008-0016120 | 2/2008 |
|---|---|---|
| KR | 10-2015-0017066 | 2/2015 |

\* cited by examiner

FIG. 9
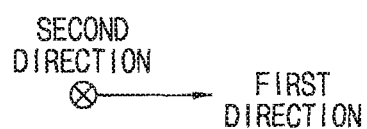
FIG. 10
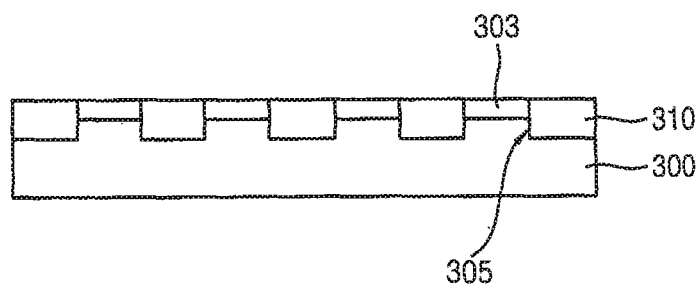
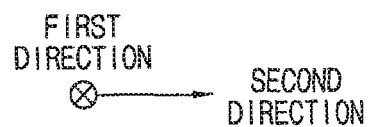

VARIABLE RESISTANCE MATERIAL LAYERS AND VARIABLE RESISTANCE MEMORY DEVICES INCLUDING THE SAME

CROSS-REFERENCE TO RELATED APPLICATION

This application claims the benefit of and priority under 35 USC §119 to Korean Patent Application No. 10-2014-0186754, filed on Dec. 23, 2014, the contents of which are herein incorporated by reference in their entirety.

FIELD

Example embodiments relate to a variable resistance memory device. More particularly, example embodiments relate to a phase-change random access memory (PRAM) device.

BACKGROUND

A PRAM device may store data by using a resistance difference between an amorphous state and a crystalline state according to a phase change of a variable resistance material layer. A phase of the variable resistance material layer may change from a crystalline state into an amorphous state at a temperature equal to or higher than the melting temperature thereof, and may change from the amorphous state into the crystalline state at a temperature equal to or higher than the crystallization temperature thereof. The melting temperature may be higher than the crystallization temperature.

When current flows in a variable resistance material layer, Joule's heat may be generated in the variable resistance material layer. The Joule's heat generated in the variable resistance material layer may change the phase of the variable resistance material layer from an amorphous state into a crystalline state or from the crystalline state into the amorphous state. That is, when current flows in a variable resistance material layer, the writing speed of a PRAM device may be determined by the phase change speed (e.g., crystallization rate) of the variable resistance material layer. When current does not flow in the variable resistance material layer, the data retention characteristics of the PRAM device may be determined by the time to keep the variable resistance material layer in the amorphous state or the crystalline state.

The variable resistance material layer of a PRAM device may include a calcogenide compound such as germanium (Ge), antimony (Sb), or tellurium (Te). However, the crystallization rate and the data retention characteristics of the calcogenide compound may be inversely proportional to each other.

SUMMARY

Example embodiments of the present inventive concepts provide a variable resistance material layer having a good thermal stability and a fast crystallization rate.

Example embodiments of the present inventive concepts provide a variable resistance memory device including a variable resistance material layer having a good thermal stability and a fast crystallization rate.

According to example embodiments of the present inventive concepts, a variable resistance material layer includes germanium (Ge), antimony (Sb), tellurium (Te), and at least one type of impurities X. The variable resistance material layer may have a composition represented by chemical formula (I) of $X_p(Ge_aSb_{(1-a-b)}Te_b)_{(1-p)}$. An atomic concentration of the impurities X in the composition represented by chemical formula (I) may be in a range of $0<p\leq0.2$. An atomic concentration of Ge in the composition represented by chemical formula (I) may be in a range of $0.05\leq a<0.19$. An atomic concentration of Te in the composition represented by chemical formula (I) may be in a range of $0.42\leq b\leq0.56$.

In example embodiments, the atomic concentration of Ge in the composition represented by chemical formula (I) may be in a range of $0.05\leq a<0.15$.

In example embodiments, the atomic concentration of Te in the composition represented by chemical formula (I) may be in a range of $0.52\leq b<0.56$.

In example embodiments, the impurities X may include any one selected from the group consisting of boron (B), carbon (C), nitrogen (N), oxygen (O), aluminum (Al), silicon (Si), phosphorous (P), and sulfur (S).

In example embodiments, the impurities X may be bismuth (Bi).

In example embodiments, the variable resistance material layer may be kept in an amorphous state for at least one year at a temperature equal to or less than about 70° C.

In example embodiments, a reset current may be equal to or less than about 200 µA.

In example embodiments, the variable resistance material layer may have a shape of a pillar. A sum of top and bottom surface areas of the pillar may be defined as M, and an area of a sidewall of the pillar may be defined as D. D may be equal to or more than three times that of M.

In example embodiments, a resistivity of the variable resistance material layer in an amorphous state thereof may be equal to or more than 2.5 times that of the variable resistance material layer in a crystalline state thereof.

In example embodiments, the variable resistance material layer has a crystallization rate of less than about 80 ns.

According to example embodiments of the present inventive concepts, a variable resistance material layer includes Ge, Sb, Te, and at least two types of impurities X and Y. The variable resistance material layer may have a composition represented by chemical formula (II) of $X_pY_q(Ge_aSb_{(1-a-b)}Te_b)_{(1-p-q)}$. A sum of atomic concentrations of the impurities X and Y in the composition represented by chemical formula (II) may be in a range of $0<p+q\leq0.2$. An atomic concentration of Ge in the composition represented by chemical formula (II) may be in a range of $0.05\leq a<0.19$. An atomic concentration of Te in the composition represented by chemical formula (II) may be in a range of $0.42\leq b\leq0.56$.

In example embodiments, the atomic concentration of Ge in the composition represented by chemical formula (II) may be in a range of $0.05\leq a<0.15$.

In example embodiments, the atomic concentration of Te in the composition represented by chemical formula (II) may be in a range of $0.52\leq b<0.56$.

According to example embodiments of the present inventive concepts, a variable resistance material layer having a composition defined by a region surrounded by first, second, third and fourth composition lines in a ternary phase diagram of germanium (Ge), antimony (Sb), and tellurium (Te) includes at least one type of impurities. The first composition line may connect compositions of which an atomic concentration of Te is about 0.42. The second composition line may connect compositions of which an atomic concentration of Te is about 0.56. The third composition line may connect compositions of which an atomic concentration of Ge is about 0.05. The fourth composition line may connect compositions of which an atomic concentration of Ge is about 0.19.

According to example embodiments of the present inventive concepts, a phase-change random access memory (PRAM) device includes a lower electrode on a substrate, a variable resistance material layer pattern on the lower electrode, and an upper electrode on the variable resistance material layer pattern. The variable resistance material layer pattern may include germanium (Ge), antimony (Sb), tellurium (Te), and at least one type of impurities X, and may have a composition represented by chemical formula (I) of $X_p(Ge_aSb_{(1-a-b)}Te_b)_{(1-p)}$. An atomic concentration of impurities X in the composition represented by chemical formula (I) may be in a range of $0<p\leq0.2$. An atomic concentration of germanium (Ge) in the composition represented by chemical formula (I) may be in a range of $0.05\leq a<0.19$. An atomic concentration of tellurium (Te) in the composition represented by chemical formula (I) may be in a range of $0.42\leq b\leq0.56$.

In example embodiments, the atomic concentration of Ge in the composition represented by chemical formula (I) may be in a range of $0.05\leq a<0.15$, and the atomic concentration of Te in the composition represented by chemical formula (I) may be in a range of $0.52\leq b<0.56$.

In example embodiments, the impurities X may include any one selected from the group consisting of boron (B), carbon (C), nitrogen (N), oxygen (O), aluminum (Al), silicon (Si), phosphorous (P), and sulfur (S), In example embodiments, the PRAM device may further include an insulation layer surrounding a sidewall of the variable resistance material layer pattern. A sum of areas of portions of the variable resistance material layer pattern contacting the upper and lower electrodes, respectively, may be defined as M. An area of the sidewall of the variable resistance material layer pattern contacting the insulation layer may be defined as D. D may be equal to or more than about three times that of M.

In example embodiments, the PRAM device may further include a diode between the substrate and the lower electrode. The diode may be electrically connected to the lower electrode.

In example embodiments, the diode may have a shape of a circle or a rectangle with rounded corners in a plan view.

In example embodiments, the variable resistance material layer pattern, the lower electrode, and the diode may have a substantially the same shape in a plan view.

According to example embodiments of the present inventive concepts, a variable resistance material layer is be provided, the variable resistance material layer including, germanium (Ge), antimony (Sb), tellurium (Te), and at least one type of impurities. The at least one type of impurities is present in the variable resistance material layer in an atomic percent of 20% or less. Ge is present in the variable resistance material layer in an atomic percent of greater than or equal to 5% and less than 19%. Te is present in the variable resistance material layer in an atomic percent of greater than or equal to 42% and less than or equal to 56%.

In example embodiments, a total atomic percent of impurities is 20% or less.

In example embodiments, the variable resistance material layer has a composition represented by chemical formula (II) $X_pY_q(Ge_aSb_{(1-a-b)}Te_b)_{(1-p)}$, wherein X and Y represent different types of impurities and q may be 0, and wherein a sum of atomic concentrations of X and Y is in a range of $0<p+q\leq0.2$, an atomic concentration of Ge is in a range of $0.05\leq a<0.19$, and an atomic concentration of Te is in a range of $0.42\leq b\leq0.56$.

In example embodiments, the variable resistance material layer has a reset current equal to or less than about 200 μA.

In example embodiments, the variable resistance material layer has a crystallization rate of less than about 80 ns.

In example embodiments, the variable resistance material layer is kept in an amorphous state for at least one year at a temperature equal to or less than about 70° C.

According to example embodiments of the present inventive concepts, a variable resistance material layer pattern is formed from a variable resistance material layer as described herein according to the present inventive concepts.

In example embodiments, the variable resistance material layer pattern has a composition represented by a chemical formula of $X_pY_q(Ge_aSb_{(1-a-b)}Te_b)_{(1-p)}$, wherein X and Y represent different types of impurities and q may be 0, and wherein a sum of atomic concentrations of X and Y is in a range of $0<p+q\leq0.2$, an atomic concentration of Ge is in a range of $0.05\leq a<0.19$, and an atomic concentration of Te is in a range of $0.42\leq b\leq0.56$.

BRIEF DESCRIPTION OF THE DRAWINGS

The above and other aspects, features and advantages of the present inventive concepts will become more apparent in view of the attached drawings and accompanying detailed description. The drawings provided herein represent non-limiting, example embodiments according to various embodiments of the present inventive concepts.

FIGS. 9 to 23 are cross-sectional views and a plan view illustrating stages of a method of manufacturing a variable resistance memory device, e.g., a PRAM device.

DESCRIPTION OF EMBODIMENTS

Figure 1:
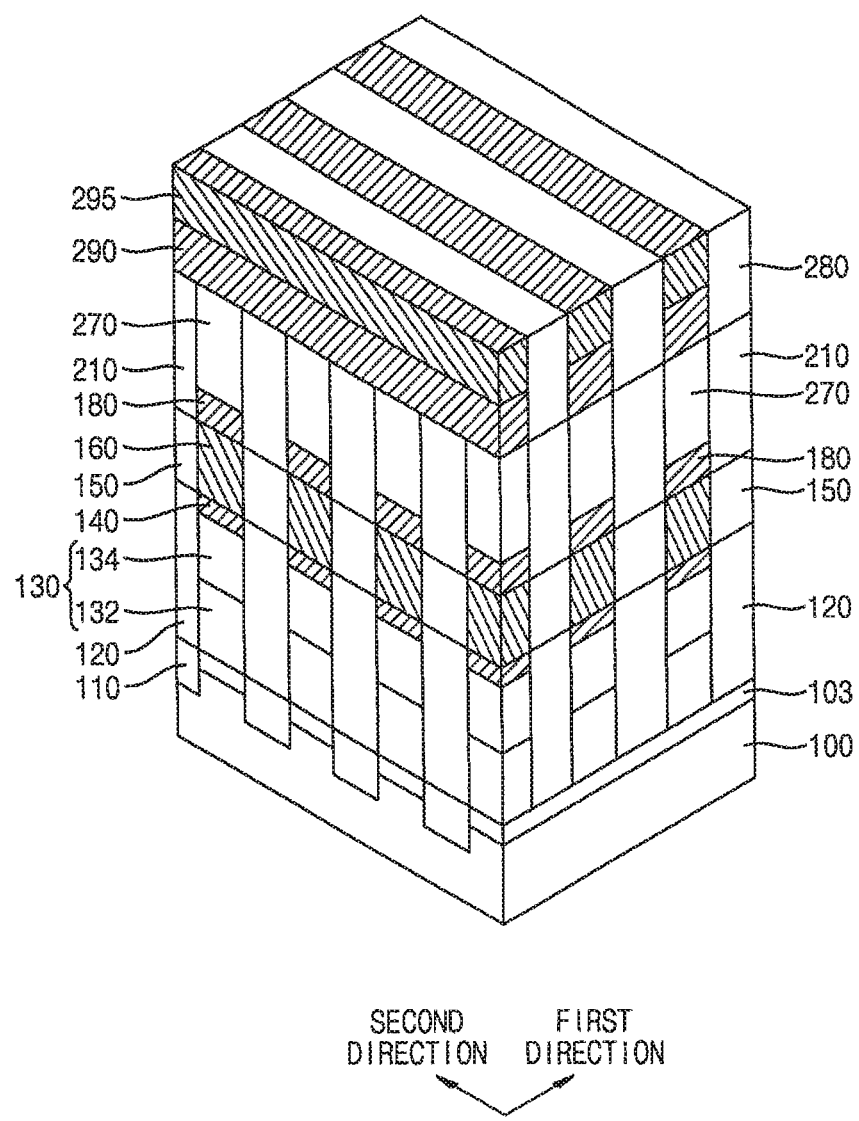
FIG. 1 is a perspective view illustrating a variable resistance memory device, e.g., a phase-change random access memory (PRAM) device, having a variable resistance material according to various embodiments of the present inventive concepts.

Various example embodiments are described below with reference to the accompanying drawings, in which some example embodiments are shown. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the disclosure.

The terminology used herein is for the purpose of describing particular example embodiments only and is not intended to be limiting of the embodiments. As used herein, the singular forms "a," "an" and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper," and the like, may be used herein for ease of disclosure to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of the present inventive concepts are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments of the present inventive concepts should not be construed as limited to the particular shapes of regions illustrated herein but are to include deviations in shapes that result, for example, from manufacturing. For example, an implanted region illustrated as a rectangle may actually have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the example embodiments.

Unless otherwise defined, all terms (including technical and scientific terms) used herein have the same meaning as commonly understood by one of ordinary skill in the art to which these present inventive concepts belong. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As used herein, the term "atomic concentration" refers to a ratio of the number of atoms contained in a material. That is, the "atomic concentration" may be a ratio of the number of specific atoms to the total number of all atoms in a material. For example, in regard to GeTe, an atomic concentration of Ge is 0.5 and an atomic concentration of Te is 0.5. Regarding $Ge_2Sb_2Te_5$, an atomic concentration of Ge is 2/9, an atomic concentration of Sb is 2/9, and an atomic concentration of the Te is 5/9.

Atomic concentration may be measured by an X-ray photoelectron spectroscopy (XPS), a secondary ion mass spectroscopy (SIMS) and/or a transmission electron microscopy (TEM), etc.

XPS may measure photoelectrons discharged out of a material by irradiating the X-ray. A kinetic energy of the photoelectrons may indicate a magnitude of a bonding force in the original position of an inner shell electron constituting the material, and thus an atomic composition of the material and a bonding state of the electrons may be measured.

SIMS may irradiate first ions to a material to perform a mass spectrometry of second ions emitted from the material. Accordingly, qualitative and quantitative analyses of the material may be performed. Particularly, a small amount of impurities contained in the material may be measured.

TEM may focus an electron beam and irradiate the focused electron beam to a sample. The electron beam having penetrated through the sample may be magnified so that a magnified image of the material may be obtained. In the TEM analysis, a composition of the sample may be analyzed by using, e.g., an energy dispersive X-ray spectroscopy (EDS), an electron loss spectroscopy (EELS), or the like.

Unless otherwise defined, all terms (including technical and scientific terms) used herein have the same meaning as commonly understood by one of ordinary skill in the art to which this disclosure belongs. It will further be understood that terms, such as those defined in commonly used dictionaries, should be interpreted as having a meaning that is consistent with their meaning in the context of the relevant art and will not be interpreted in an idealized or overly formal sense unless expressly so defined herein.

Referring to FIG. 1, a variable resistance memory device, e.g., a PRAM device, may include a word line 103, a switching element, a phase-change memory unit, and a bit line 295 on a substrate 100. The variable resistance memory device may further include a plug 160 and an ohmic pattern 140.

The substrate 100 may be a semiconductor substrate, e.g., a silicon substrate, a germanium substrate, a silicon-germanium substrate, a silicon-on-insulator (SOI) substrate, a germanium-on-insulator (GOI) substrate, or the like.

The substrate 100 may be divided into an active region and a field region by an isolation layer pattern 110 thereon. A region of the substrate 100 on which the isolation layer pattern 110 is formed may be defined as the field region, and a region of the substrate 100 on which the isolation layer pattern 110 is not formed may be defined as the active region.

In example embodiments, the isolation layer pattern 110 may extend along a first direction substantially parallel to a top surface of the substrate 100. A plurality of isolation layer patterns 110 may be arranged along a second direction substantially perpendicular to the first direction. The isolation layer pattern 110 may include a silicon oxide, e.g., boro-phospho silicate glass (BPSG), phospho silicate glass (PSG), undoped silicate glass (USG), spin on glass (SOG), flowable oxide (FOX), tetraethyl orthosilicate (TEOS), high density plasma chemical vapor deposition (HDP-CVD) oxide, or the like.

The word line 103 may be formed at an upper portion of each active region of the substrate 100. Thus, the word line 103 may extend along the first direction, and a plurality of word lines 103 may be arranged along the second direction. In example embodiments, the word line 103 may include n-type impurities, e.g., phosphorus, arsenic, or the like. Alternatively, the word line 103 may include p-type impurities, e.g., boron, gallium, or the like.

The switching element may include a diode 130 shown in FIG. 1, or a transistor. In example embodiments, the diode 130 may be formed in a first opening (not shown) through a first insulation layer 120 on the substrate 100, and may be electrically connected to the word line 103. The first insulation layer 120 may include an oxide, e.g., silicon oxide.

In example embodiments, a plurality of first openings may be formed on each word line 103 along the first direction. Accordingly, a plurality of diodes 130 filling lower portions of the first openings, respectively, may be formed both in the first and second directions to form a diode array.

In example embodiments, the first opening may have a shape of, e.g., a circle, an oval, a rectangle with rounded corners, or the like. For example, the first opening may have a shape of a square with rounded corners.

Each of the diodes 130 may include a lower diode layer 132 and an upper diode layer 134 sequentially stacked. In example embodiments, each of the lower and upper diodes 132 and 134 may include silicon doped with impurities. In some embodiments, the lower diode 132 may include n-type impurities, e.g., phosphorus, arsenic, or the like, and the upper diode 134 may include p-type impurities, e.g., boron, gallium, or the like.

The ohmic pattern 140 may be formed on the diode 130, and may fill a remaining portion of the first opening, i.e., an upper portion of the first opening. In example embodiments, the ohmic pattern 140 may be formed of a metal silicide, e.g., cobalt silicide, nickel silicide, tungsten silicide, or the like. The ohmic pattern 140 may reduce contact resistance between the diode 130 and the plug 160. In some embodiments, the ohmic pattern 140 may not be formed.

The plug 160 may fill second openings (not shown), which may be formed through a second insulation layer 150 on the first insulation layer 120 and in fluid communication with the first openings, respectively, and thus may be electrically connected to the ohmic pattern 140. The second insulation layer 150 may include an oxide, e.g., silicon oxide.

In example embodiments, the second opening may have an area in a plan view substantially the same as that of the first opening. Accordingly, a sidewall of the diode 130 may be continuously connected to a sidewall of the plug 160, and a top surface of the diode 130 may have an area substantially the same as that of a bottom surface of the plug 160 directly contacting the top surface of the diode 130.

In other example embodiments, a barrier layer pattern (not shown) may be further formed on the bottom surface and the sidewall of the plug 160. For example, the barrier layer pattern may include a metal nitride to prevent the diffusion of atoms constituting the plug 160. In some embodiments, the plug 160 may not be formed.

The variable resistance memory device may include a lower electrode 180, a variable resistance material layer pattern 270, and an upper electrode 290 sequentially stacked.

The lower electrode 180 may be formed between the plug 160 and the variable resistance material layer pattern 270, and the variable resistance material layer pattern 270 may be heated so that a phase of the variable resistance material layer pattern 270 may be changed.

In example embodiments, the lower electrode 180 may have a shape substantially the same as that of the diode 130, in a plan view. For example, when the diode 130 has a shape of a rectangle with rounded corners, the lower electrode 180 may also have a shape of a rectangle with rounded corners.

In example embodiments, the lower electrode 180 may be formed to include a metal or a metal compound, e.g., a metal nitride, a metal silicon nitride, or the like. The lower electrode 180 may be formed to include a metal, e.g., tungsten, aluminum, copper, tantalum, titanium, molybdenum, niobium, zirconium, or the like, a metal nitride, or a metal silicon nitride. These materials may be used alone or in any combination.

The variable resistance material layer pattern 270 may be formed on the lower electrode 180. A bottom surface of the variable resistance material layer pattern 270 may have a shape and an area substantially the same as a shape and an area, respectively, of a top surface of the lower electrode 180. For example, the variable resistance material layer pattern 270 may have a shape of a rectangle with rounded corners.

The variable resistance material layer pattern 270 may include germanium (Ge), antimony (Sb), tellurium (Te), and at least one impurity X. The composition of the variable resistance material layer pattern 270 will be described later in detail.

A physical size of the variable resistance material layer pattern 270 may be limited. For example, a sum of areas of portions of the variable resistance material layer pattern 270 directly contacting the lower and upper electrodes 180 and 290, respectively, may be defined as M. An area of a portion of the variable resistance material layer pattern 270 directly contacting a third insulation layer 210 may be defined as D.

In example embodiments, a ratio of D to M (D/M) may be equal to or more than about 3.

Figure 2:
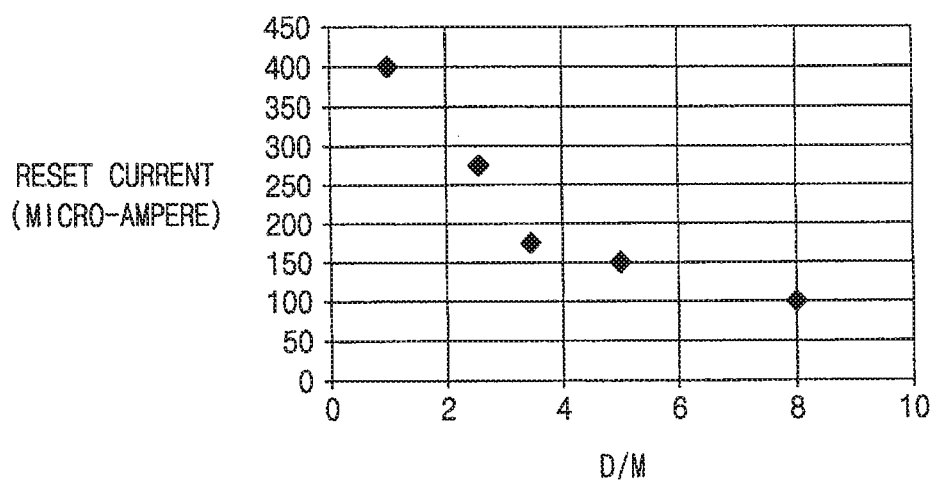
FIG. 2 is a graph illustrating a reset current with respect to the ratio of D/M of a variable resistance material layer pattern as described in accordance with the Experimental Examples.

FIG. 2 illustrates a reset current of the variable resistance material layer pattern 270 according to the ratio of D/M. The reset current may mean a current for changing a resistance of the variable resistance material layer pattern 270. When the reset current increases, a writing speed of the variable resistance memory device may decrease.

Referring to FIG. 2, as the ratio of D/M decreases, a reset current of the variable resistance memory device increases. That is, as the ratio of D/M decreases, heat loss through the upper and lower electrodes 290 and 180 may increase, and thus more energy may be required for melting the variable resistance material layer pattern 270. As a result, in order to keep the reset current equal to or less than about 200 µA, the ratio of D/M of the variable resistance material layer pattern 270 has to be equal to or more than about 3.

The third insulation layer 210 may cover sidewalls of the lower electrodes 180 and the variable resistance material layer patterns 270. The third insulation layer 210 may include an oxide, e.g., silicon oxide.

The upper electrode 290 may be formed on the third insulation layer 210, and contact the variable resistance material layer pattern 270. For example, the upper electrode 290 may include a material substantially the same as that of the lower electrode 180.

The bit line 295 may be formed on the upper electrode 290. In example embodiments, the bit line 295 may include a metal, e.g., copper (Cu), aluminum (Al), tungsten (W), or the like.

In example embodiments, each of the bit line 295 and the upper electrode 290 may have a shape of a line or a bar extending along the second direction. A plurality of bit lines 295 and a plurality of upper electrodes 290 may be formed along the first direction.

According to example embodiments, the variable resistance material layer pattern 270 may have a fast crystallization rate and a good thermal stability. Accordingly, the PRAM device having the variable resistance material layer pattern 270 may have a fast write speed and superior data retention characteristics.

The variable resistance device may have the shape shown in FIG. 1, however, the present inventive concepts are not limited thereto, and may have various other shapes if necessary.

A variable resistance material layer may include Ge, Sb, Te, and at least one type of impurities X. That is, the variable resistance material layer may be formed by adding at least one type of impurities of groups III, IV and VI to a Ge—Sb—Te compound.

In example embodiments, the variable resistance material layer may have a composition represented by a chemical formula (I) of $X_p(Ge_aSb_{(1-a-b)}Te_b)_{(1-p)}$.

The impurities X may be selected from boron (B), carbon (C), nitrogen (N), oxygen (O), aluminum (Al), silicon (Si), phosphorous (P), and sulfur (S), preferably, from C, N, and O. Alternatively, the impurities X may be bismuth (Bi).

An atomic concentration of the impurities X, "p", in the composition represented by chemical formula (I) may be in a range of $0<p\leq0.20$.

An atomic concentration of Ge, "a", in the composition represented by chemical formula (I) may be in a range of $0.05\leq a<0.19$. When the atomic concentration of Ge, "a", exceeds a predetermined value, the resistance change temperature of the variable resistance material layer may be increased too much, and thus a resistance change rate may decrease. When the atomic concentration of Ge, "a", is less than a predetermined value, an amorphous phase of the variable resistance material layer may become unstable.

An atomic concentration of Te, "b", in the composition represented by chemical formula (I) may be in a range of $0.42\leq b\leq0.56$. When the atomic concentration of Te, "b", is less than 0.42, the resistivity difference of the variable resistance material layer between a crystalline state and an amorphous state may be too small.

As a result, in the variable resistance material layer in which the impurities X are added to the Ge—Sb—Te compound, when the atomic concentration of Ge, "a", is equal to or more than about 0.05 and less than about 0.19, the atomic concentration of Te, "b", is equal to or more than about 0.42 and equal to or less than about 0.56, and the atomic concentration of the impurities X, "p", are equal to or less than about 0.2, the variable resistance material layer may have a fast crystallization rate and a good thermal stability. Additionally, the resistivity difference between a crystalline state and an amorphous state may be small.

In other example embodiments, the variable resistance material layer may include at least two types of impurities X and Y. In this case, X may indicate first impurities, and Y may indicate second impurities. The variable resistance material layer may have a composition represented by a chemical formula (II) of $X_pY_q(Ge_aSb_{(1-a-b)}Te_b)_{(1-p-q)}$.

The first and second impurities X and Y may be selected from, e.g., B, C, N, O, Al, Si, P, and S. In example embodiments, the first and second impurities X and Y may be selected from C, N, and O. Alternatively, the first impurities X and/or the second impurities Y may be Bi. In example embodiments, the first impurities X or the second impurities Y may be Bi and the other may be selected from, e.g., B, C, N, O, Al, Si, P, and S. In example embodiments, both the first impurities X and the second impurities Y may be selected from, e.g., B, C, N, O, Al, Si, P, and S, but the first impurities X and the second impurities Y are different.

A sum of an atomic concentration of the first impurities X, "p", and an atomic concentration of the second impurities Y, "q", in the composition represented by chemical formula (II) may be in a range of $0<p+q\leq0.20$.

An atomic concentration of Ge, "a", in the composition represented by chemical formula (II) may be in a range of $0.05\leq a<0.19$, and an atomic concentration of Te, "b", in the composition represented by chemical formula (II) may be in a range of $0.42\leq b\leq0.56$.

In example embodiments, in the variable resistance material layer in which at least two types of impurities X and Y are added to the Ge—Sb—Te compound, when the atomic concentration of Ge, "a", is equal to or more than about 0.05 and less than about 0.19, the atomic concentration of Te, "b", is equal to or more than about 0.42 and equal to or less than about 0.56, and the atomic concentration of the first impurities X, "p", is equal to or less than about 0.2, the variable resistance material layer may have a fast crystallization rate and a good thermal stability. Additionally, the resistivity difference between a crystalline state and an amorphous state may be small.

Figure 3:
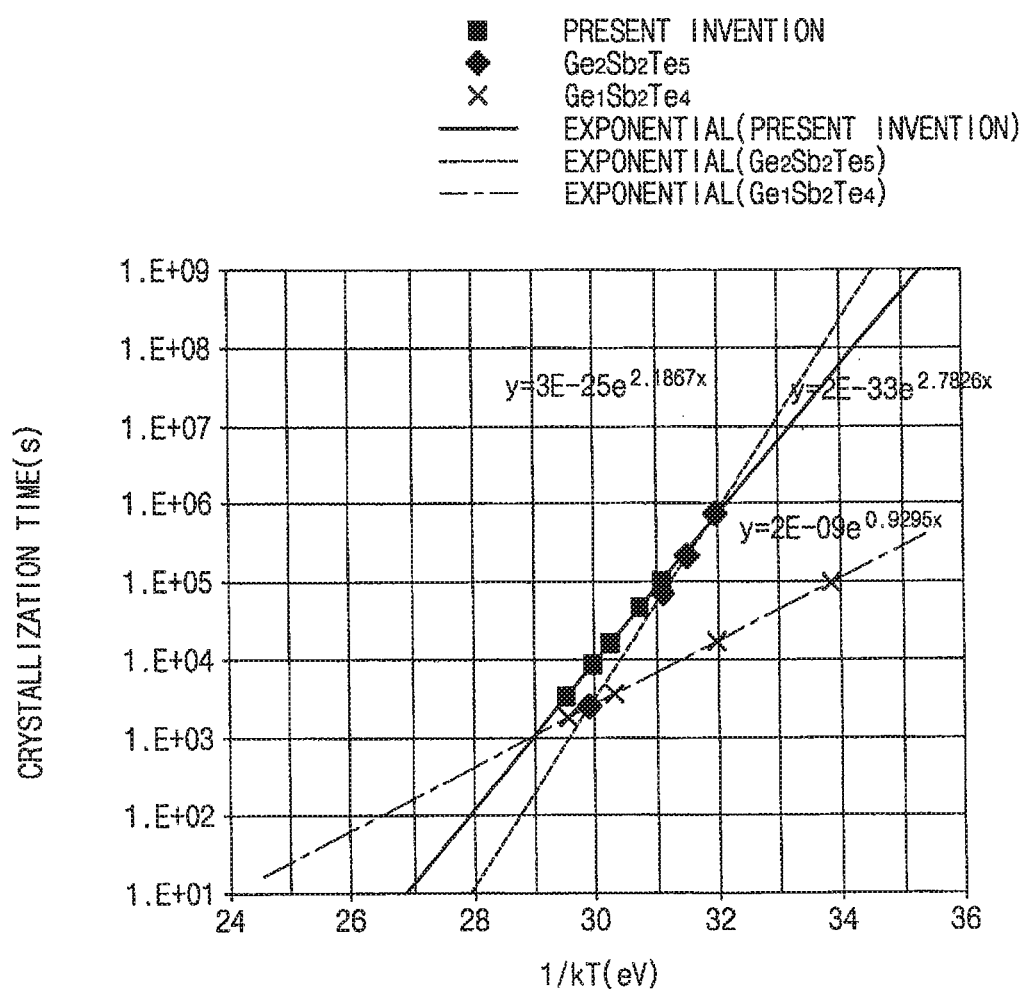
FIG. 3 is a graph illustrating a crystallization time with respect to a temperature of a variable resistance material as described in accordance with an Experimental Example and Comparative Experimental Examples.
Figure 4:
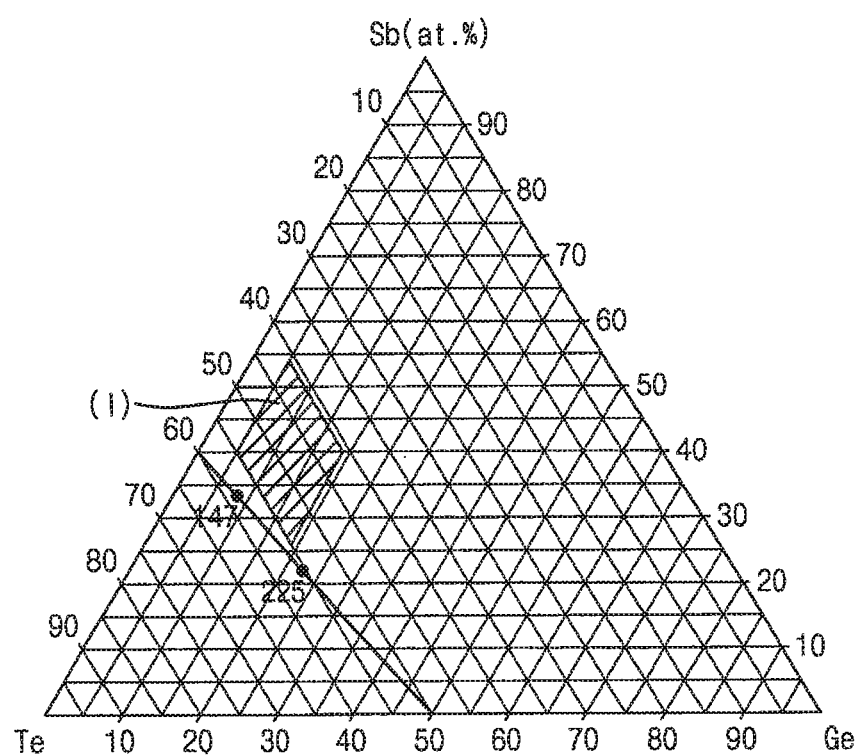
FIG. 4 is a ternary phase diagram of germanium (Ge), antimony (Sb), and tellurium (Te) illustrating a composition of a germanium antimony telluride (GST) material.

FIG. 3 is a graph illustrating thermal stabilities of variable resistance material layers in amorphous states in accordance with Experimental Example and Comparative Experimental Examples, respectively. FIG. 4 is a ternary phase diagram of Ge, Sb, and Te illustrating a composition of a germanium antimony telluride (GST) material.

In FIG. 3, the X-axis represents 1/kT, wherein T means a temperature and k means the Boltzmann constant. The Y-axis represents a crystallization time on a logarithmic scale in which the variable resistance material layers in the amorphous states may be crystallized at the temperature T.

That is, when the value on the Y-axis in FIG. 3 is high, the thermal stability of the variable resistance material layer may be good. Generally, when a variable resistance material layer is used in a variable resistance memory device, the crystallization time of the variable resistance material layer in an amorphous state with no current applied thereto (that is, the data retention characteristics) may have a standard of 10 years. That is, when a temperature corresponding to the standard crystallization time of 10 years is high, the thermal stability of the variable resistance material layer may be good.

In FIG. 3, Experimental Example of the present invention is a material satisfying the above-mentioned composition represented by the chemical formula (I) of $X_p(Ge_aSb_{(1-a-b)}Te_b)_{(1-p)}$. Comparative Experimental Example 1 is a variable resistance material layer having a composition represented by a chemical formula of $Ge_2Sb_2Te_5$ to which no impurities are added. Comparative Experimental Example 2 is a variable resistance material layer having a composition represented by a chemical formula of $Ge_1Sb_2Te_4$ to which no impurities are added. As shown in FIG. 4, $Ge_2Sb_2Te_5$ and $Ge_1Sb_2Te_4$ are located on a tie-line of $Sb_2Te_3$—GeTe in the ternary phase diagram.

According to the results of FIG. 3, the variable resistance material layer of Experimental Example according to embodiments of the present inventive concepts has a crystallization time greater than that of the variable resistance material layer of Comparative Experimental Examples 1 and 2. That is, the variable resistance material layer in accordance with Experimental Example may have a better thermal stability than that of Comparative Experimental Examples 1 and 2 at a temperature equal to or more than about 90° C.

FIG. 4 is a ternary phase diagram of Ge, Sb, and Te illustrating a composition of a GST material.

The variable resistance material layer in accordance with example embodiments may include Ge, Sb, Te, and at least one type of impurities X. That is, the variable resistance material layer may be formed by adding at least one type of impurities from groups III, IV, V and VI to a Ge—Sb—Te compound.

The composition of the variable resistance material layer including Ge, Sb and Te may be illustrated again with reference to the ternary phase diagram of FIG. 4, except for the impurities. That is, the variable resistance material layer in accordance with example embodiments may further include impurities X in the GST shown in FIG. 4.

In FIG. 4, the composition of the variable resistance material layer including Ge, Sb, and Te may be defined by a plurality of composition lines.

For example, a first composition line may connect compositions of which an atomic concentration of Te is about 0.42. A second composition line may connect compositions of which an atomic concentration of Te is about 0.56. A third composition line may connect compositions of which an atomic concentration of Ge is about 0.05. A fourth composition line may connect compositions of which an atomic concentration of Ge is about 0.19.

In the ternary phase diagram of Ge, Sb, and Te, the variable resistance material layer may have a composition defined by a region surrounded by the first to fourth composition lines, and further include at least one type of impurities.

In example embodiments, the impurities may be selected from, e.g., B, C, N, O, Al, Si, P, and S. An atomic concentration of the impurities may be in a range of about 0 to about 0.20.

In example embodiments, in the ternary phase diagram of Ge, Sb, and Te, the variable resistance material layer may not overlap with a composition line connecting GeTe—$Sb_2Te_3$. In other words, unlike the conventional variable resistance material layer, the variable resistance material layer in accordance with example embodiments of the present inventive concepts may be spaced apart form the composition line connecting GeTe—$Sb_2Te_3$. In this case, the variable resistance material layer may satisfy required characteristics, e.g., a thermal stability, a resistance change rate, and a resistivity difference between the crystalline states.

The resistivity difference between a crystalline state and an amorphous state may be equal to or greater than a given ratio. When a set resistance of the variable resistance memory device is defined as R0 and a reset resistance of the variable resistance memory device is defined as R1, $\log_{10}$(R1/R0) may be equal to or more than about 0.4. That is, the reset resistance R1 may be at least about 2.5 times of the set resistance R0. When satisfying the above conditions, the variable resistance material layer may be able to be used in the variable resistance memory device.

Experimental Example 1

A lower electrode was formed on a diode on a word line. A variable resistance material layer having a cylindrical structure of which a diameter was about 15 nm and a height was about 40 nm was formed on the lower electrode. A sum of areas of portions of the variable resistance material layer contacting the lower and upper electrodes, respectively, are defined as M. An area of a dielectric layer surrounded by a sidewall of the variable resistance material layer is defined as D. A ratio of D to M (D/M) was about 5.3, and the variable resistance material layer had a composition represented by a chemical formula of $Al_2Ge_{9.8}Sb_{39.2}Te_{49}$. The upper electrode was formed, and a bit line was formed on the upper electrode in a direction substantially perpendicular to the word line. Then, characteristics of the manufactured variable resistance memory device, e.g., a set resistance, a reset resistance, a reset current, a 10-year guarantee temperature, a set speed, or the like, were measured.

Experimental Example 2

A lower electrode was formed on a diode on a word line. A variable resistance material layer having a cylindrical structure of which a diameter was about 15 nm and a height was about 40 nm was formed on the lower electrode. D/M was about 5.4, and the variable resistance material layer had a composition represented by a chemical formula of $N_5Ge_{9.5}Sb_{38}Te_{47.5}$. The upper electrode was formed, and a bit line was formed on the upper electrode in a direction substantially perpendicular to the word line. Then, characteristics of the manufactured variable resistance memory device, e.g., a set resistance, a reset resistance, a reset current, a 10-year guarantee temperature, a set speed, or the like, were measured.

Comparative Experimental Example 1

A lower electrode was formed on a diode on a word line. A variable resistance material layer having a cylindrical structure of which a diameter was about 15 nm and a height was about 40 nm was formed on the lower electrode. D/M was about 5.3, and the variable resistance material layer had a composition represented by a chemical formula of $Ge_2Sb_2Te_5$. The upper electrode was formed, and a bit line was formed on the upper electrode in a direction substantially perpendicular to the word line. Then, characteristics of the manufactured variable resistance memory device were measured and compared with Experimental Example of the present invention.

The variable resistance memory device of Comparative Experimental Example 1 had a low set speed of about 200 ns, and thus a high-speed operation may be difficult.

Comparative Experimental Example 2

A lower electrode was formed on a diode on a word line. A variable resistance material layer having a cylindrical structure of which a diameter was about 15 nm and a height was about 40 nm was formed on the lower electrode. D/M was about 5.3, and the variable resistance material had a composition represented by a chemical formula of $Al_{30}Ge_7Sb_{28}Te_{35}$. That is, the variable resistance material layer contained too much Al, and thus did not satisfy the composition range of the present invention. The upper electrode was formed, and a bit line was formed on the upper electrode in a direction substantially perpendicular to the word line. Then, characteristics of the manufactured variable resistance memory device were measured and compared with Experimental Example of the present invention.

The variable resistance memory device of Comparative Experimental Example 2 may not be suitable as a variable resistance memory device, because the difference between the set resistance and the reset resistance was not sufficiently large.

Comparative Experimental Example 3

A lower electrode was formed on a diode on a word line. A variable resistance material layer having a cylindrical structure of which a diameter was about 20 nm and a height was about 25 nm was formed on the lower electrode. A sum of areas of portions of the variable resistance material layer pattern contacting the lower and upper electrodes, respectively, are defined as M. An area of a dielectric layer surrounded by a sidewall of the variable resistance material layer pattern is defined as D. D/M was about 2.5, and was less than 3, which is proposed by the present inventive concepts. The variable resistance material layer had a composition represented by a chemical formula of $N_5Ge_{9.5}Sb_{38}Te_{47.5}$. The upper electrode was formed, and a bit line was formed on the upper electrode in a direction substantially perpendicular to the word line.

The variable resistance memory device of Comparative Experimental Example 3 may not be suitable as a variable resistance memory device, because the reset current had such a large value of about 280 µA. This is because the ratio of D to M was so small that thermal energy that may be lost simultaneously with heat generation was too large.

Comparative Experimental Example 4

A lower electrode was formed on a diode on a word line. A variable resistance material layer having a cylindrical structure of which a diameter was about 15 nm and a height was about 40 nm was formed on the lower electrode. D/M was about 5.3, and the variable resistance material layer had a composition represented by a chemical formula of $Al_{15}Ge_{8.5}Sb_{34}Te_{42.5}$. The variable resistance material layer contained too little Te, and thus did not satisfy the composition range according to embodiments of the present inventive concepts. The upper electrode was formed, and a bit line was formed on the upper electrode in a direction substantially perpendicular to the word line. Then, characteristics of the manufactured variable resistance memory device were measured and compared with Experimental Example of the present invention.

The variable resistance memory device of Comparative Experimental Example 4 may not be suitable as a variable resistance memory device, because the ratio of the set resistance to the reset resistance was too small.

Comparative Experimental Example 5

A lower electrode was formed on a diode on a word line. A variable resistance material layer having a cylindrical structure of which a diameter was about 15 nm and a height was about 40 nm was formed on the lower electrode. D/M was about 5.3, and the variable resistance material had a composition represented by a chemical formula of $Al_{15}Ge_{8.5}Sb_{17}Te_{59.5}$. The variable resistance material contained too much Te, and thus did not satisfy the composition range of the present inventive concepts. The upper electrode was formed, and a bit line was formed on the upper electrode in a direction substantially perpendicular to the word line. Then, characteristics of the manufactured variable resistance memory device were measured and compared with Experimental Example of the present invention.

An adhesive characteristic of the variable resistance memory device of Comparative Experimental Example 5 was poor, the variable resistance memory device did not work after several times of operations. That is, the composition of Comparative Experimental Example 5 was not suitable as a variable resistance memory device due to the poor endurance.

Comparative Experimental Example 6

A lower electrode was formed on a diode on a word line. A variable resistance material layer having a cylindrical structure of which a diameter was about 15 nm and a height was about 40 nm was formed on the lower electrode. D/M was about 5.3, and the variable resistance material had a composition represented by a chemical formula of $N_5Ge_{2.9}Sb_{42.7}Te_{49.4}$. The variable resistance material contained too little Ge, and thus did not satisfy the composition range of the present invention. The upper electrode was formed, and a bit line was formed on the upper electrode in a direction substantially perpendicular to the word line. Then, characteristics of the manufactured variable resistance memory device were measured and compared with Experimental Example of the present invention.

The variable resistance memory device of Comparative Experimental Example 6 had a low reset resistance, a high reset current, and a very low 10-year guarantee temperature, and thus may not be suitable as a variable resistance memory device.

Comparative Experimental Example 7

A lower electrode was formed on a diode on a word line. A variable resistance material layer having a cylindrical structure of which a diameter was about 15 nm and a height was about 40 nm was formed on the lower electrode. D/M was about 5.3, and the variable resistance material had a composition represented by a chemical formula of $N_5Ge_{19}Sb_{28.5}Te_{47.5}$. The variable resistance material contained too much Ge, and thus did not satisfy the composition range of the present invention. The upper electrode was formed, and a bit line was formed on the upper electrode in a direction substantially perpendicular to the word line. Then, characteristics of the manufactured variable resistance memory device were measured and compared with Experimental Example of the present invention.

The variable resistance memory device of Comparative Experimental Example 6 may not be suitable as a variable resistance memory device, because the set speed was too slow.

TABLE 1

| | Set resistance | Reset resistance | Reset current | 10-year guarantee temperature | Set speed |
|---|---|---|---|---|---|
| Experimental Example 1 | 18 Kohm | 320 Kohm | 180 µA | 73° C. | 10 ns |
| Experimental Example 2 | 25 Kohm | 560 Kohm | 170 µA | 77° C. | 15 ns |
| Comparative Experimental Example 1 | 40 Kohm | 1.2 Mohm | 180 µA | 72° C. | 200 ns |
| Comparative Experimental Example 2 | 8 Kohm | 21 Kohm | 230 µA | 25° C. | 10 ns |
| Comparative Experimental Example 3 | 20 Kohm | 310 Kohm | 280 µA | 72° C. | 10 ns |
| Comparative Experimental Example 4 | 12 Kohm | 29 Kohm | 200 µA | 70° C. | 10 ns |
| Comparative Experimental Example 5 | — | — | — | — | — |
| Comparative Experimental Example 6 | 10 Kohm | 230 Kohm | 210 µA | 34° C. | 10 ns |
| Comparative Experimental Example 7 | 43 Kohm | 2.5 Mohm | 170 µA | 34° C. | 190 ns |

Figure 5:
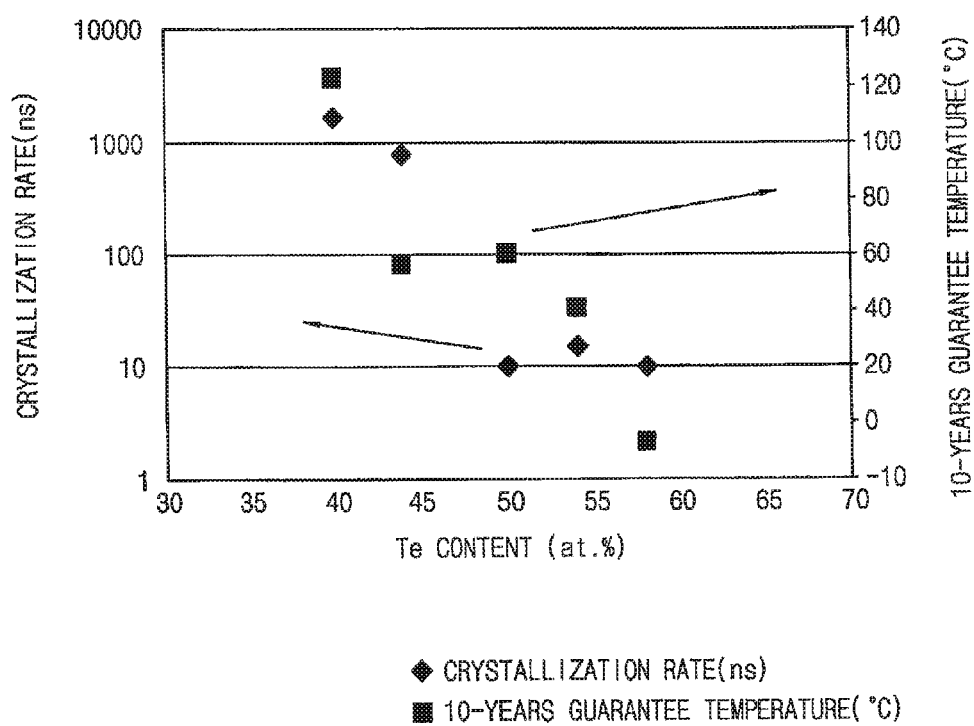
FIG. 5 is a graph illustrating a crystallization rate and 10-year guarantee temperature with respect to a Te content (atomic percent) of a variable resistance material layer in accordance with Experimental Example and Comparative Experimental Examples.

As a result, the variable resistance material layer in accordance with example embodiments may have a good thermal stability and a fast working speed. Moreover, the variable resistance material layer in accordance with example embodiments may have a sufficiently large set resistance value and a reset resistance value. FIG. 5 is a graph illustrating a crystallization rate and a 10-year guarantee temperature with respect to a Te content of a variable resistance material layer in accordance with Experimental Example and Comparative Experimental Examples.

In FIG. 5, the X-axis represents a Te content (at. %). The left Y-axis represents a crystallization rate (ns) of the variable resistance material layer associated with a writing speed of the variable resistance memory device including the variable resistance material layer. Right Y-axis represents a 10-year guarantee temperature (° C.) of the variable resistance material layer associated with data retention characteristics of the variable resistance memory device including the variable resistance material layer.

In FIG. 5, as a value on the right Y-axis increases, the thermal stability of the variable resistance material layer may increase. As a value on the left Y-axis (that is, time) decreases, the writing speed of the variable resistance memory device including the variable resistance material layer may increase.

An experiment about the variable resistance material layer in FIG. 5 was performed with changing a ratio of the sum of Ge and Sb with respect to Te in a GST layer having no impurities. As shown in FIG. 5, as the Te content increased, the 10-year guarantee temperature decreased and the crystallization rate increased. That is, when the Te content exceeded about 45 at. %, the crystallization rate was enhanced. When the Te content exceeded about 50 at. %, the crystallization rate was more enhanced. When the Te content was less than about 58 at. %, preferably, equal to or less than about 55 at. %, the variable resistance material layer had an excellent value of the 10-year guarantee temperature. Accordingly, the conditions for the 10-year guarantee temperature and the crystallization rate were satisfied at the same time in a specific Te content region. For example, when the Te content was at least about 52 at. % and less than about 56 at. %, the required conditions were satisfied at the same time.

As described below, impurities may be added to increase the 10-year guarantee temperature.

Figure 6:
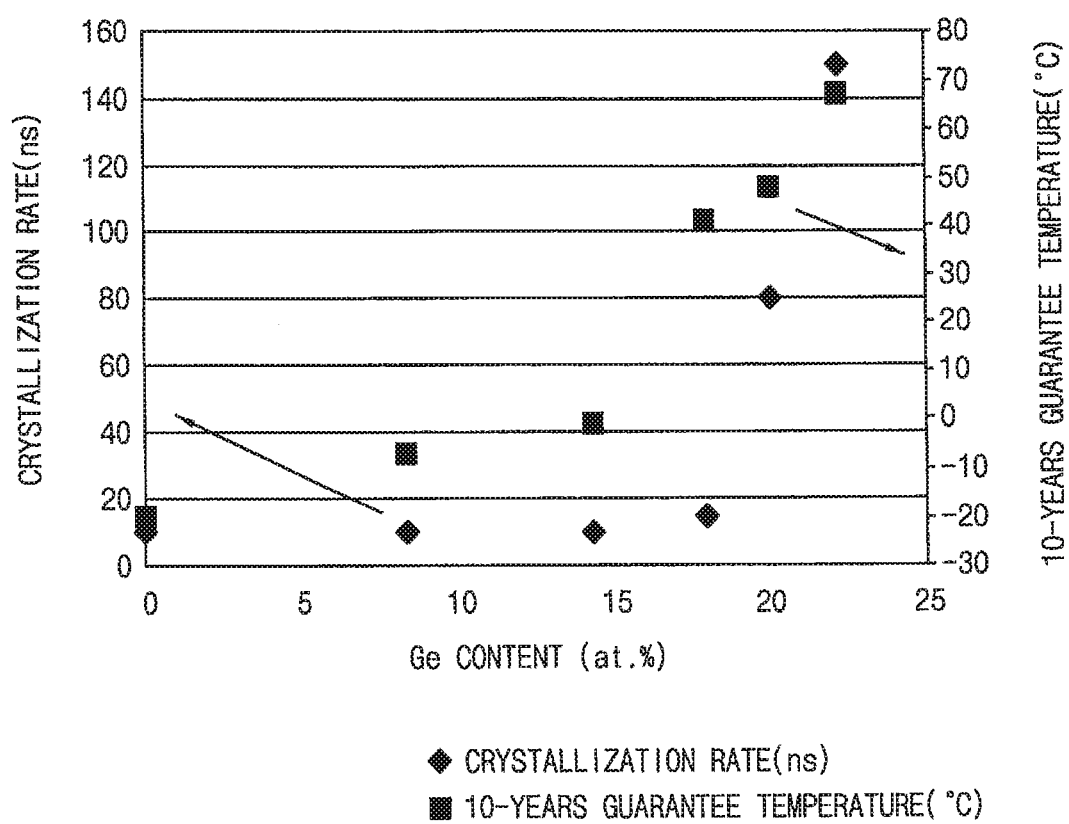
FIG. 6 is a graph illustrating a crystallization rate and a 10-year guarantee temperature with respect to a Ge content (atomic percent) of a variable resistance material layer in accordance with Experimental Example and Comparative Experimental Example.

FIG. 6 is a graph illustrating a crystallization rate and a 10-year guarantee temperature with respect to a Ge content of a variable resistance material layer in accordance with Experimental Example and Comparative Experimental Examples.

In FIG. 6, the X-axis represents a Ge content (at. %). The left and right Y-axes may be substantially the same as those of FIG. 5.

An experiment about the variable resistance material layer in FIG. 6 was performed with changing a ratio of the sum of Te and Sb with respect to Ge in a GST layer having no impurities. As shown in FIG. 6, as Ge content increased, the 10-year guarantee temperature increased and the crystallization rate decreased. That is, when the Ge content exceeded about 20 at. %, the crystallization rate exceeded about 80 ns, and thus the variable resistance material layer may not be proper to be used. On the other hand, when the Ge content was equal to or less than about 20 at. %, the 10-year guarantee temperature was low. As illustrated above, the 10-year guarantee temperature may be increased by adding impurities. However, when the Ge content was less than about 5 at. %, even with the addition of the impurities, the required thermal stability was not obtained. Accordingly, when the Ge content was equal to or more than about 5 at. % and less than about 15 at. %, the required characteristics were satisfied.

Figure 7:
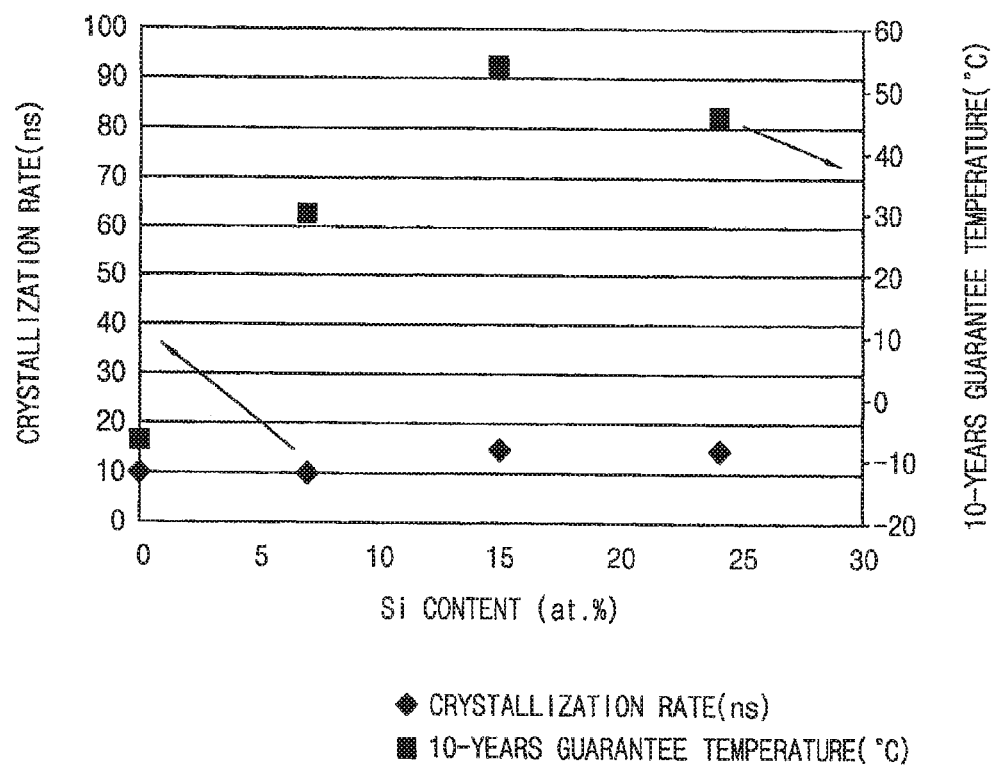
FIG. 7 is a graph illustrating a crystallization rate and a 10-year guarantee temperature with respect to a Si content (atomic percent) of a variable resistance material layer in accordance with Experimental Example.
Figure 8:
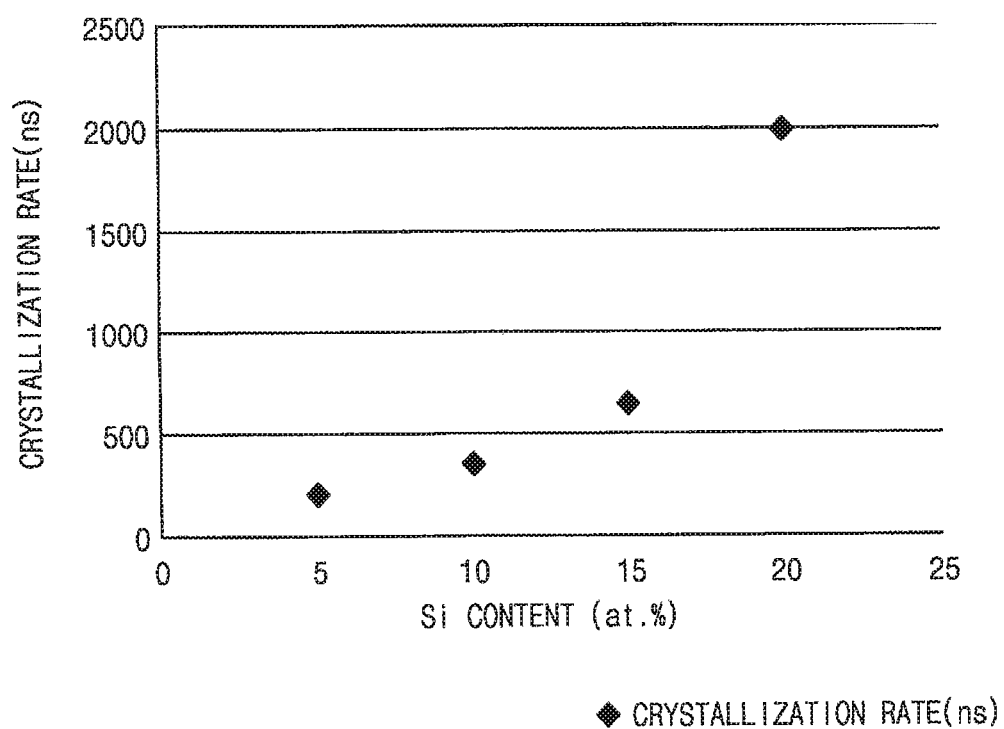
FIG. 8 is a graph illustrating a crystallization rate with respect to a Si content (atomic percent) of a variable resistance material layer in accordance with comparative embodiments.

FIG. 7 is a graph illustrating a crystallization rate and a 10-year guarantee temperature with respect to a Si content of a variable resistance material layer in accordance with Experimental Example. FIG. 8 is a graph illustrating a crystallization rate with respect to a Si content of a variable resistance material layer in accordance with Comparative Experimental Examples.

A variable resistance material layer in FIG. 7 including the above-mentioned contents of Ge, Sb, and Te in accordance with Experimental Example further included silicon (Si). The 10-year guarantee temperature was increased as a silicon content was increased when compared to a case in which no Si was added. On the other hand, the crystallization rate was constant regardless of the Si content. However, when the content of impurities exceeded about 20 at. %, the phase separation of the variable resistance material layer occurred, and thus the variable resistance material layer may not be suitable as a variable resistance memory device.

A variable resistance material layer in FIG. 8 was formed by adding Si to $Ge_2Sb_2Te_5$ having contents of Ge, Sb, and Te different from those of the variable resistance material layer in accordance with Experimental Example. As shown in FIG. 8, the crystallization rate decreased as the Si content was increased.

As a result, only in the GST composition ranges of the present inventive concepts may the 10-year guarantee temperature be increased by doping impurities and the crystallization rate may be maintained.

Figure 11:
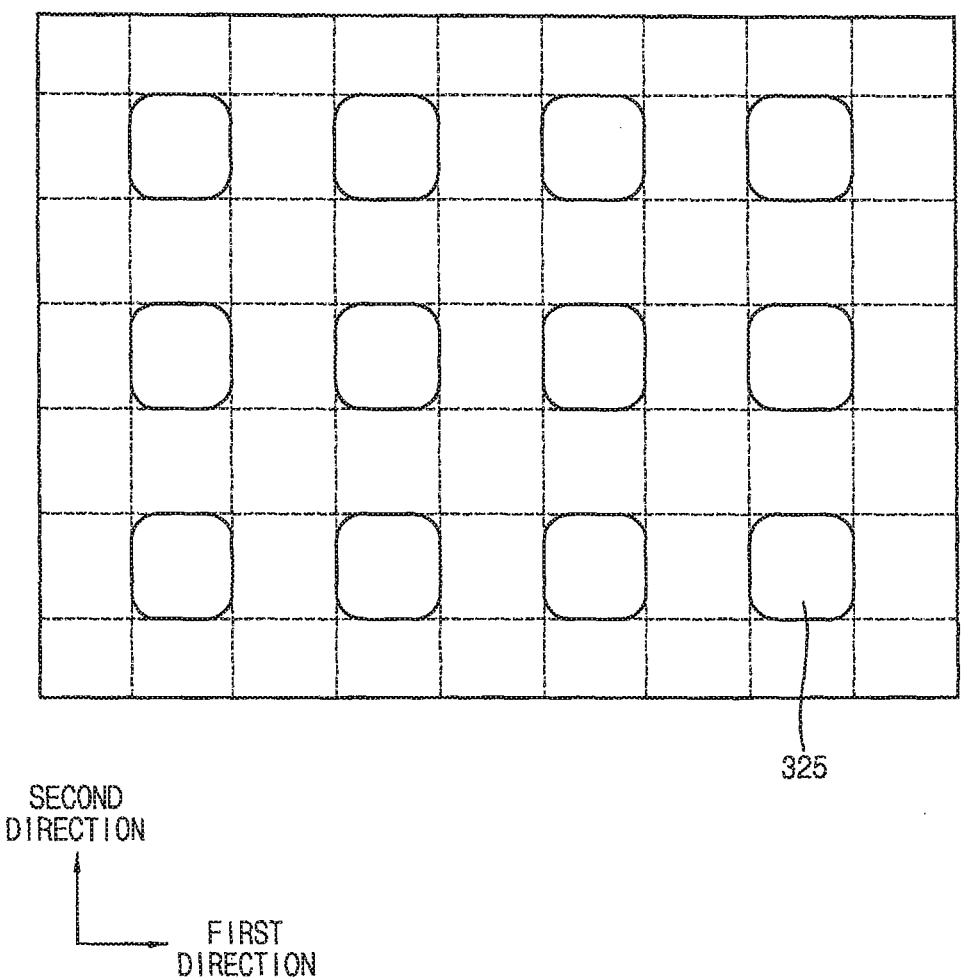

FIGS. 9 to 23 are cross-sectional views and a plan view illustrating stages of a method of manufacturing a variable resistance memory device, e.g., a PRAM device. Particularly, each of FIGS. 9, 12, 14, 16, 18, 20, and 22 illustrates a cross-sectional view of the PRAM device taken along a first direction. Each of FIGS. 10, 13, 15, 17, 19, 21, and 23 illustrates a cross-sectional view of the PRAM device taken along a second direction substantially perpendicular to the first direction. FIG. 11 illustrates a plan view of the PRAM device.

Referring to FIGS. 9 and 10, impurities may be implanted into an upper portion of a substrate 300 to form an impurity region. An isolation layer pattern 310 may be formed on the substrate 300 to divide the substrate 300 into an active region and a field region, and to form word lines 303.

The impurity region may be formed by implanting first impurities, e.g., n-type impurities or p-type impurities into the upper portion of the substrate 300. The n-type impurities may include phosphorus, arsenic, or the like. The p-type impurities may include boron, gallium, or the like. In an example embodiment, the first impurities may include n-type impurities. A well region (not shown) doped with impurities having a conductivity type different from that of the first impurities may be further formed under the impurity region in the substrate 300.

In example embodiments, the isolation layer pattern 310 may be formed by a shallow trench isolation (STI) process. Particularly, a plurality of trenches 305 may be formed on the substrate 300, and an isolation layer may be formed on the substrate 300 to sufficiently fill the trenches 305. The isolation layer may be planarized until a top surface of the substrate 300 may be exposed to form the isolation layer pattern 310. The isolation layer pattern 310 may be formed to include a silicon oxide, e.g., BPSG, PSG, USG, SOG, FOX, TEOS, plasma enhanced tetraethyl orthosilicate (PE-TEOS), HDP-CVD oxide, or the like. In example embodiments, the planarization process may be performed by a chemical mechanical polishing (CMP) process and/or an etch-back process. In example embodiments, the isolation layer pattern 310 may extend along the first direction substantially parallel to the top surface of the substrate 300, and a plurality of isolation layer patterns 310 may be formed along the second direction substantially perpendicular to the first direction. Accordingly, the active region may extend along the first direction, and a plurality of active regions may be formed along the second direction.

In example embodiments, a bottom surface of the isolation layer pattern 310 may be formed to be lower than that of the impurity region. Accordingly, the impurity region in the upper portion of the active region may be divided by the isolation layer pattern 310 to form a plurality of word lines 303. In example embodiments, a plurality of word lines 303 may be formed along the second direction, and each of the word lines 303 may extend along the first direction.

Figure 12:
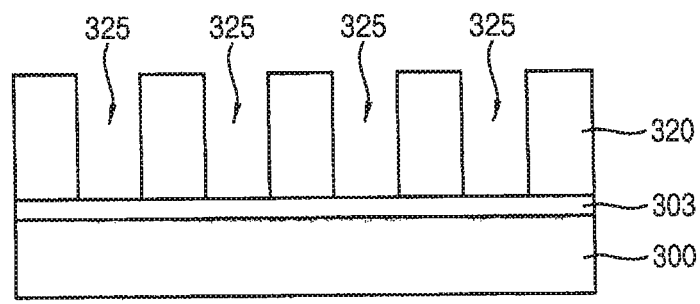
Figure 13:
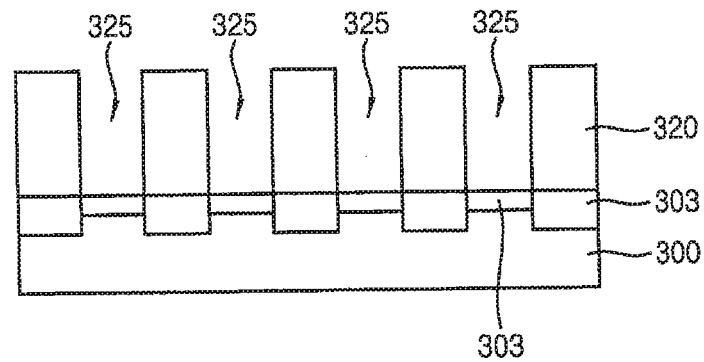

Referring to FIGS. 11 to 13, a first insulating interlayer 320 having a plurality of first contact holes 325 therethrough arranged at regular intervals both in the first and second directions may be formed on the substrate 300 and the isolation layer pattern 310.

The first contact holes 325 may be formed by anisotropically etching the first insulating interlayer 320 until top surfaces of the word lines 303 may be exposed. The first insulating interlayer 320 may be formed to include an insulating material, e.g., an oxide, a nitride, or the like.

In example embodiments, each of the first contact holes 325 may be formed to have a shape of, e.g., a circle, an oval, a rectangle with rounded corners, or the like, in a plan view. For example, each of the first contact holes 325 may have a shape of a square having rounded corners.

In example embodiments, a distance between neighboring ones of the first contact holes 325 in the first direction or in the second direction may be similar to a width of each of the first contact holes 325 in the first direction or in the second direction.

Figure 14:
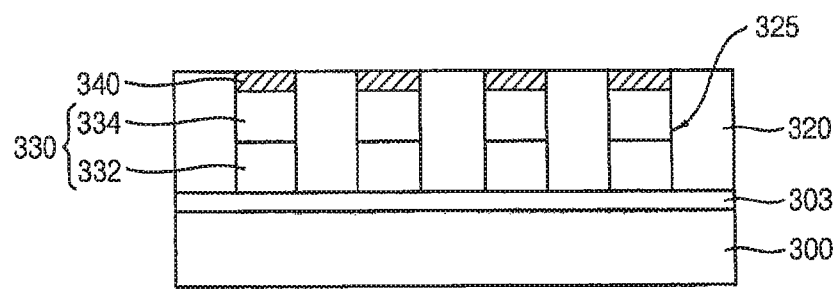
Figure 15:
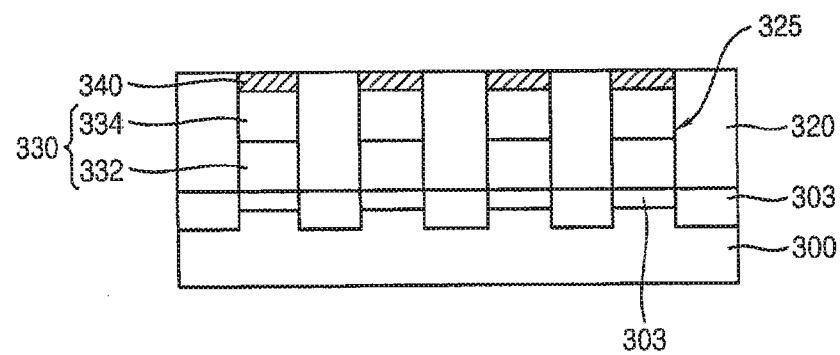

Referring to FIGS. 14 and 15, a diode 330 and an ohmic pattern 340 may be sequentially formed to fill each of the first contact holes 325.

In example embodiments, a selective epitaxial growth (SEG) process may be performed using top surfaces of the word lines 303 exposed by the first contact holes 325 as a seed layer to form a silicon layer filling each of the first contact holes 325. Second and third impurities may be implanted into lower and upper portions of the silicon layer to form the diode 330. Accordingly, the lower and upper portions of the silicon layer may be defined as a lower diode layer 332 and an upper diode layer 334, respectively. The lower diode layer 332 may contact the top surfaces of the word line 303. In some embodiments, a planarization process may be further performed on the silicon layer before implanting the second and third impurities so that a top surface of the diode 330 may be substantially coplanar with a top surface of the first insulating interlayer 320.

In example embodiments, the second impurities may include n-type impurities, e.g., phosphorus, arsenic, or the like, and the third impurities may include p-type impurities, e.g., boron, gallium, or the like.

The ohmic pattern 340 may reduce contact resistance between the diode 330 and a lower electrode 360 (refer to FIGS. 18 and 19) subsequently formed. In example embodiments, a metal layer may be formed on the diode 330 and the first insulating interlayer 320, and the metal layer may be reacted with silicon contained in the diode 330 by a heat treatment to form the ohmic pattern 340. The metal layer may include a metal, e.g., cobalt, nickel, tungsten, or the like. Accordingly, the ohmic pattern 340 may be formed to include a metal silicide, e.g., cobalt silicide, nickel silicide, tungsten silicide, or the like. An unreacted portion of the metal layer may be removed.

Alternatively, the ohmic pattern 340 may be formed by directly implanting metal ions into an upper portion of the diode 330. In some embodiments, the ohmic pattern 340 may not be formed.

The diode 330 and the ohmic pattern 340 may be formed in each of the first contact holes 325. Thus, a plurality of diodes 330 and a plurality of ohmic patterns 340 may be formed both in the first and second directions to form a diode array and an ohmic pattern array, respectively.

Figure 16:
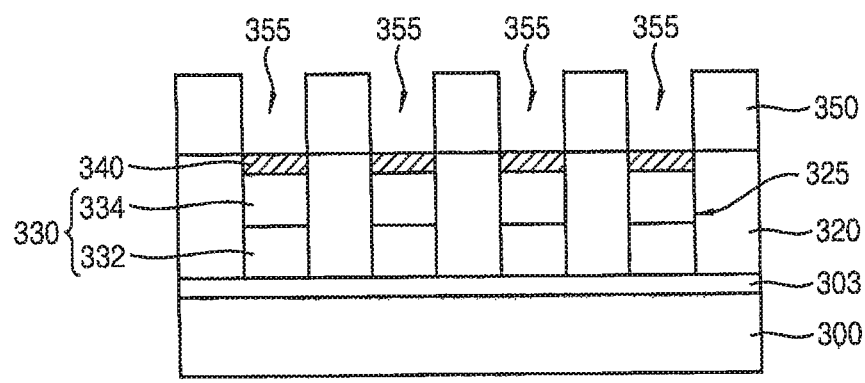
Figure 17:
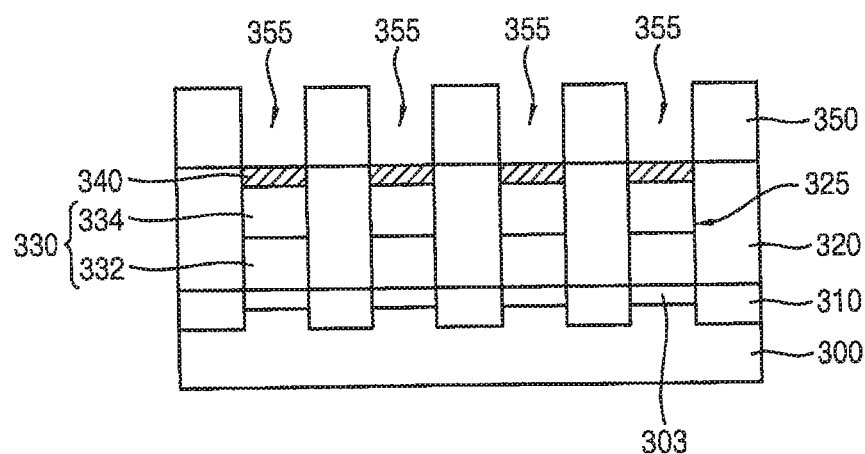

Referring to FIGS. 16 and 17, processes substantially the same as or similar to those illustrated with reference to FIGS. 11 to 13 may be performed to form a second insulating interlayer 350 on the first insulating interlayer 320 and the ohmic patterns 340. The second insulating interlayer 350 may have a plurality of second contact holes 355 therethrough that may be arranged at regular intervals both in the first and second directions.

The second insulating interlayer 350 may be formed on the first insulating interlayer 320 and the ohmic pattern 340 to include an insulating material, e.g., an oxide, a nitride, or the like. The second insulating interlayer 350 may be anisotropically etched until top surfaces of the ohmic patterns 340 may be exposed to form the second contact holes 355. The second contact holes 355 may form a second contact hole array.

Figure 18:
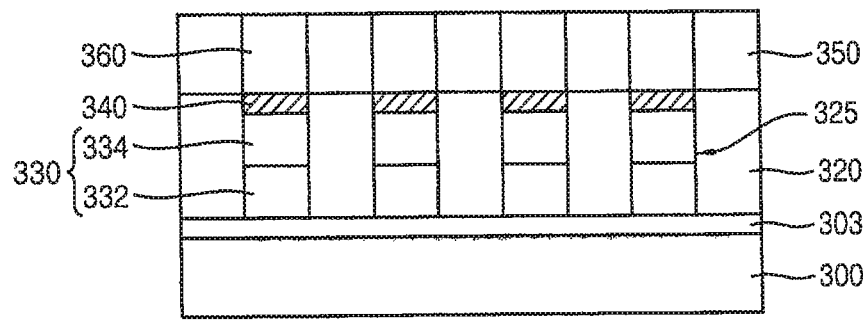
Figure 19:
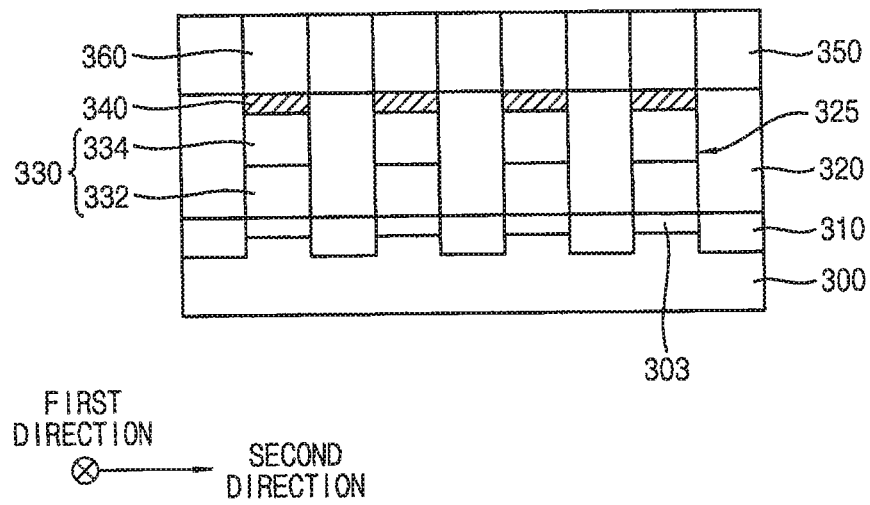

Referring to FIGS. 18 and 19, a lower electrode 360 may be formed to fill each of the second contact holes 355. A plurality of lower electrodes 360 may be formed both in the first and second directions to form a lower electrode array.

In example embodiments, a lower electrode layer may be formed on the top surfaces of the ohmic patterns 340 exposed by the second contact holes 355, sidewalls of the second contact holes 355, and a top surface of the second insulating interlayer 350, and an upper portion of the lower electrode layer may be planarized until the top surface of the second insulating interlayer 350 may be exposed to form the lower electrode 360.

The lower electrode layer may be formed to include a metal or a metal compound, e.g., a metal nitride, a metal silicon nitride, or the like. The lower electrode 360 may be formed to include a metal, e.g., tungsten, aluminum, copper, tantalum, titanium, molybdenum, niobium, zirconium, or the like, a metal nitride, or a metal silicon nitride. These materials may be used alone or in any combination thereof.

Figure 20:
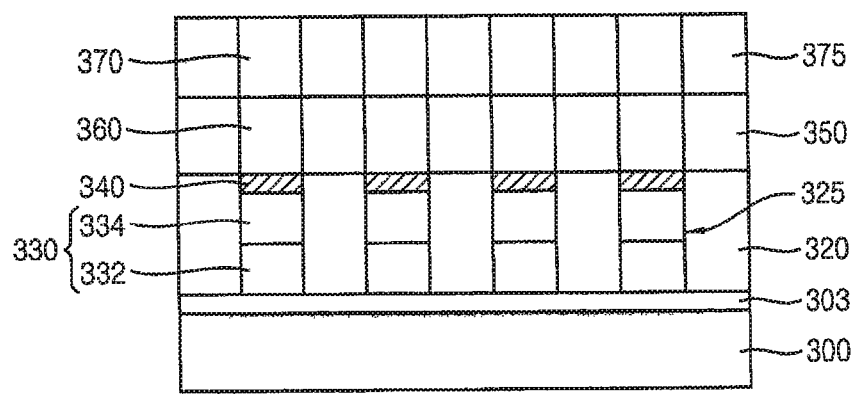
Figure 21:
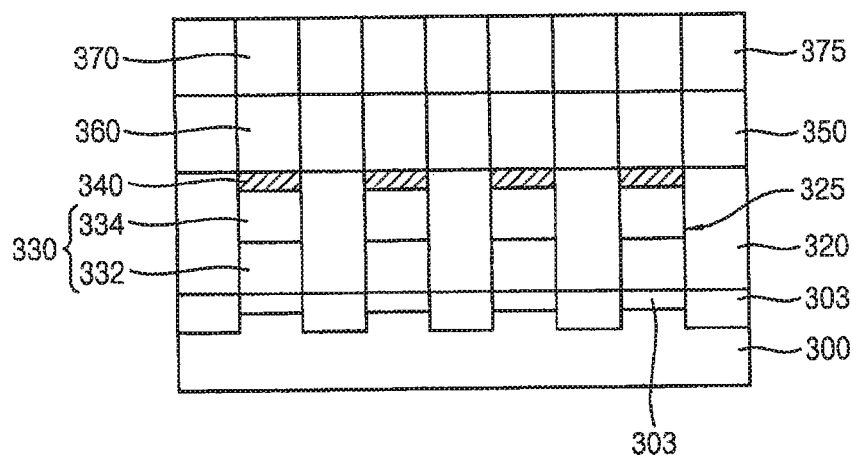

Referring to FIGS. 20 and 21, a third insulating interlayer 375 may be formed, and a variable resistance material layer pattern 370 may be formed through the third insulating interlayer 375.

Particularly, the third insulating interlayer 375 may be formed on the second insulating interlayer 350 and the lower electrodes 360. The third insulating interlayer 375 may be partially removed to form third contact holes (not shown) exposing top surfaces of the lower electrode 360. A variable resistance material layer filling the third contact holes may be formed on the third insulating interlayer 375. An upper portion of the variable resistance material layer may be removed to form the variable resistance material layer pattern 370 in each of the third contact holes.

The variable resistance material layer may be formed by a process, e.g., a sputtering process, a chemical vapor deposition (CVD) process, a cyclic CVD process, an atomic layer deposition (ALD) process, or the like. For example, when the variable resistance material layer is formed by the ALD process, the variable resistance material layer having desired composition may be stably formed by controlling an implantation time or an implantation cycle of a source. Alternatively, when the variable resistance material layer is formed by the sputtering process, the sputtering process may be performed at a high speed.

A composition of the variable resistance material layer may satisfy the above-mentioned composition conditions.

Figure 22:
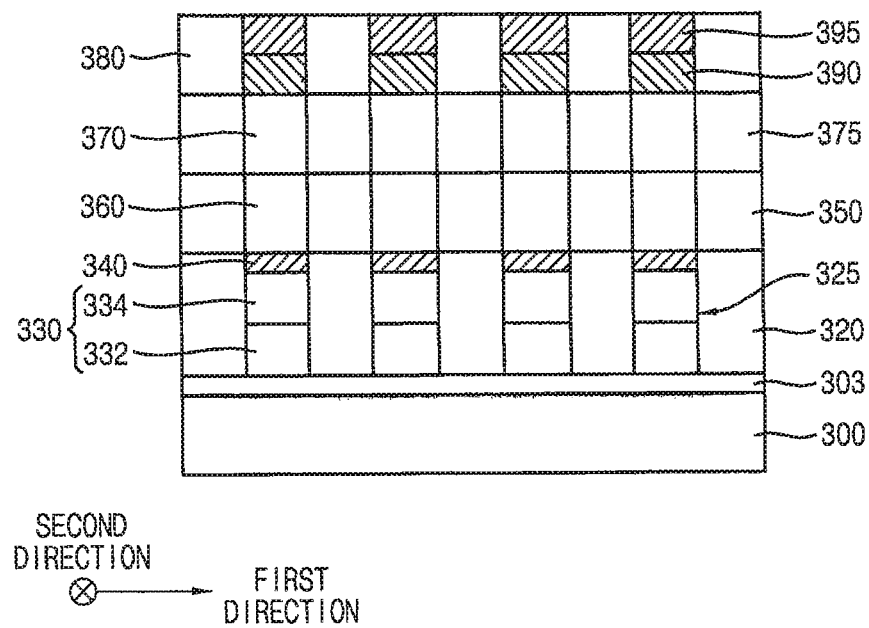
Figure 23:
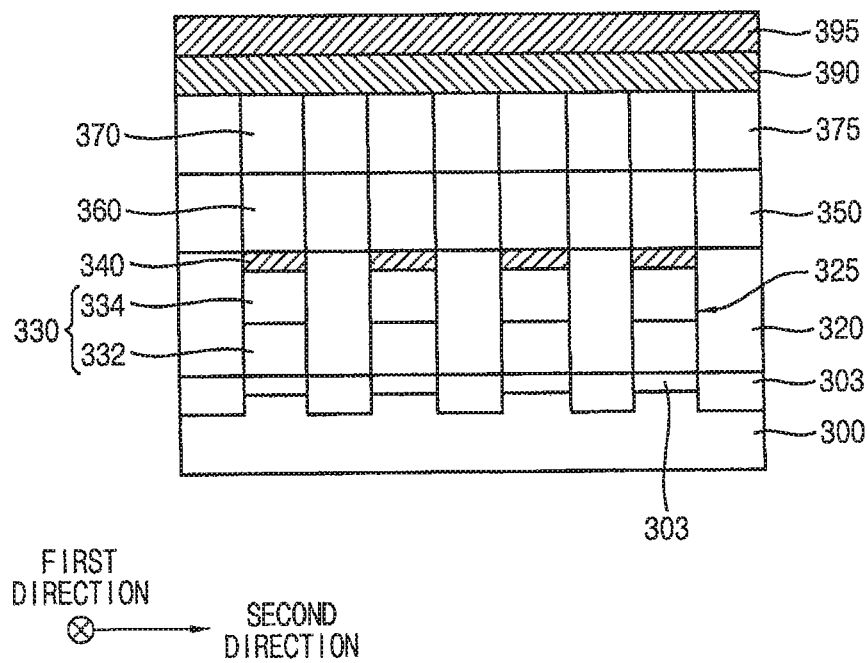

Referring to FIGS. 22 and 23, a fourth insulating interlayer 380 may be formed, and an upper electrode 390 and a bit line 395 may be sequentially formed through the fourth insulating interlayer 380.

The fourth insulating interlayer 380 may be formed on the variable resistance material layer pattern 370 and the third insulating interlayer 375, and may be partially removed to form openings (not shown). Each of the openings may expose the variable resistance material layer pattern 370 and extend along the second direction. The upper electrode 390 and the bit line 395 may be formed to fill the openings.

The foregoing is illustrative of the present inventive concepts and is not to be construed as limiting thereof.

Although a few example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the present inventive concepts as well as the appended claims.

What is claimed is:

1. A variable resistance material layer, comprising germanium (Ge), antimony (Sb), tellurium (Te), and at least one type of impurities (X),
wherein the variable resistance material layer has a composition represented by a chemical formula of $X_p(Ge_aSb_{(1-a-b)}Te_b)_{(1-p)}$,
and wherein an atomic concentration of X is in a range of $0<p\leq0.2$,
an atomic concentration of Ge is in a range of $0.05\leq a<0.19$,
and an atomic concentration of Te is in a range of $0.42\leq b\leq0.56$,
wherein the variable resistance material layer has a shape of a pillar,
wherein a sum of top and bottom surface areas of the pillar is defined as M and an area of a sidewall of the pillar is defined as D, and
wherein D is equal to or more than three times that of M.

2. The variable resistance material layer of claim 1, wherein the atomic concentration of Ge is in a range of $0.05\leq a<0.15$.

3. The variable resistance material layer of claim 1, wherein the atomic concentration of Te is in a range of $0.52\leq b<0.56$.

4. The variable resistance material layer of claim 1, wherein X is selected from the group consisting of boron (B), carbon (C), nitrogen (N), oxygen (O), aluminum (Al), silicon (Si), phosphorous (P), and sulfur (S).

5. The variable resistance material layer of claim 1, wherein X is bismuth (Bi).

6. The variable resistance material layer of claim 1, wherein the variable resistance material layer is kept in an amorphous state for at least one year at a temperature equal to or less than about 70° C.

7. The variable resistance material layer of claim 1, wherein a reset current of the variable resistance material layer is equal to or less than about 200 μA.

8. The variable resistance material layer of claim 1, wherein a resistivity of the variable resistance material layer in an amorphous state is equal to or more than 2.5 times that of the variable resistance material layer in a crystalline state.

9. A variable resistance material layer, comprising germanium (Ge), antimony (Sb), tellurium (Te), and at least two types of impurities, wherein one of the at least two types of impurities is represented by X and the other is represented by Y,
wherein the variable resistance material layer has a composition represented by a chemical formula of $X_pY_q(Ge_aSb_{(1-a-b)}Te_b)_{(1-p-q)}$,
and wherein a sum of atomic concentrations of X and Y is in a range of $0<p+q\leq0.2$, an atomic concentration of Ge is in a range of 0.05≤a<0.19, an atomic concentration of Te is in a range of 0.42≤b≤0.56, wherein the variable resistance material layer has a shape of a pillar, wherein a sum of top and bottom surface areas of the pillar is defined as M and an area of a sidewall of the pillar is defined as D, and wherein D is equal to or more than three times that of M.

10. The variable resistance material layer of claim 9, wherein the atomic concentration of Ge is in a range of 0.05≤a<0.15.

11. The variable resistance material layer of claim 9, wherein the atomic concentration of Te is in a range of 0.52≤b<0.56.

12. A phase-change random access memory (PRAM) device, comprising:
a lower electrode on a substrate;
a variable resistance material layer pattern on the lower electrode; and
an upper electrode on the variable resistance material layer pattern,
wherein the variable resistance material layer pattern includes germanium (Ge), antimony (Sb), tellurium (Te), and at least one type of impurities (X), and has a composition represented by a chemical formula of $X_p(Ge_aSb_{(1-a-b)}Te_b)_{(1-p)}$,
wherein an atomic concentration of X is in a range of 0<p≤0.2,
an atomic concentration of germanium (Ge) is in a range of 0.05≤a<0.19,
and an atomic concentration of tellurium (Te) is in a range of 0.42≤b≤$_{0.56}$, wherein a sum of areas of portions of the variable resistance material layer pattern contacting the upper and lower electrodes, respectively, is defined as M, an area of the sidewall of the variable resistance material layer pattern contacting the insulation layer is defined as D, and wherein D is equal to or more than about three times that of M.

13. The PRAM device of claim 12, wherein the atomic concentration of Ge is in a range of 0.05≤a<0.15, and wherein the atomic concentration of Te is in a range of 0.52<b<0.56.

14. The PRAM device of claim 12, wherein X is selected from the group consisting of boron (B), carbon (C), nitrogen (N), oxygen (O), aluminum (Al), silicon (Si), phosphorous (P), and sulfur (S).

15. The PRAM device of claim 12, further comprising an insulation layer surrounding a sidewall of the variable resistance material layer pattern.

16. The PRAM device of claim 12, further comprising a diode between the substrate and the lower electrode, the diode being electrically connected to the lower electrode.

17. The PRAM device of claim 16, wherein, in a plan view, the diode has a shape of a circle or a rectangle with rounded corners.

18. The PRAM device of claim 17, wherein, in a plan view, the variable resistance material layer pattern, the lower electrode, and the diode have substantially the same shape.

19. The variable resistance material layer of claim 1, wherein the variable resistance material layer has a crystallization rate of less than about 80 ns.

* * * * *